(12) United States Patent
Barth et al.

(10) Patent No.: US 7,763,519 B2
(45) Date of Patent: Jul. 27, 2010

(54) METHOD FOR FABRICATING AN INTERCONNECT ARRANGEMENT WITH INCREASED CAPACITIVE COUPLING AND ASSOCIATED INTERCONNECT ARRANGEMENT

(75) Inventors: Hans-Joachim Barth, München (DE); Jürgen Holz, Dresden (DE)

(73) Assignee: Infineon Technologies AG, Munich (DE)

( * ) Notice: Subject to any disclaimer, the term of this patent is extended or adjusted under 35 U.S.C. 154(b) by 326 days.

(21) Appl. No.: 11/205,767

(22) Filed: Aug. 16, 2005

(65) Prior Publication Data

US 2007/0042542 A1    Feb. 22, 2007

(30) Foreign Application Priority Data

Aug. 17, 2004   (DE) ................ 10 2004 039 803

(51) Int. Cl.
   *H01L 21/20*   (2006.01)
(52) U.S. Cl. .................... 438/387; 438/3; 438/396; 438/386; 438/296; 257/301; 257/302; 257/305; 257/E21.019; 257/E21.653
(58) Field of Classification Search .......... 438/239, 438/243, 244, 3, 387, 396, 386, 296; 257/301–305, 257/E21.019, E21.653
   See application file for complete search history.

(56) References Cited

U.S. PATENT DOCUMENTS

| | | | |
|---|---|---|---|
| 6,320,214 B1 * | 11/2001 | Matsuda et al. | 257/295 |
| 6,649,464 B2 | 11/2003 | Lee | |
| 6,740,221 B2 * | 5/2004 | Cheung et al. | 205/104 |
| 6,750,115 B1 * | 6/2004 | Ning et al. | 438/401 |
| 6,794,262 B2 * | 9/2004 | Ning et al. | 438/396 |
| 6,838,352 B1 * | 1/2005 | Zhao | 438/386 |
| 6,888,220 B2 * | 5/2005 | Akiyama | 257/532 |
| 6,919,233 B2 * | 7/2005 | Papa Rao et al. | 438/128 |
| 7,060,557 B1 * | 6/2006 | Zhao et al. | 438/253 |
| RE40,602 E * | 12/2008 | Matsuda et al. | 257/295 |
| 2002/0155676 A1 | 10/2002 | Stetter et al. | |
| 2002/0163029 A1 | 11/2002 | Dirnecker et al. | |
| 2002/0190814 A1 * | 12/2002 | Yamada et al. | 333/187 |
| 2003/0057558 A1 | 3/2003 | Akiyama et al. | |
| 2004/0056324 A1 * | 3/2004 | Ning et al. | 257/528 |
| 2004/0081811 A1 * | 4/2004 | Casper et al. | 428/209 |
| 2005/0093397 A1 * | 5/2005 | Yamada et al. | 310/320 |

FOREIGN PATENT DOCUMENTS

WO       WO 03/009361 A2     1/2003

OTHER PUBLICATIONS

German Office Action from corresponding German Patent Application No. DE 10 2004 039 803.8.

* cited by examiner

*Primary Examiner*—Zandra Smith
*Assistant Examiner*—Telly D Green
(74) *Attorney, Agent, or Firm*—Brinks Hofer Gilson & Lione

(57) ABSTRACT

A method for fabricating an interconnect arrangement with increased capacitive coupling is described. A trench structure is formed in a first dielectric having a capacitor region with a first aspect ratio and an interconnect region with a second aspect ratio connected thereto. The trench structure of the interconnect region is completely filled by a first interconnect. The trench structure of the capacitor region is only partially filled by a first capacitor electrode and is completely filled by a capacitor dielectric and a second capacitor electrode. In a second dielectric formed thereon, a second interconnect with a contact via is formed, which is connected to the second capacitor electrode.

31 Claims, 7 Drawing Sheets

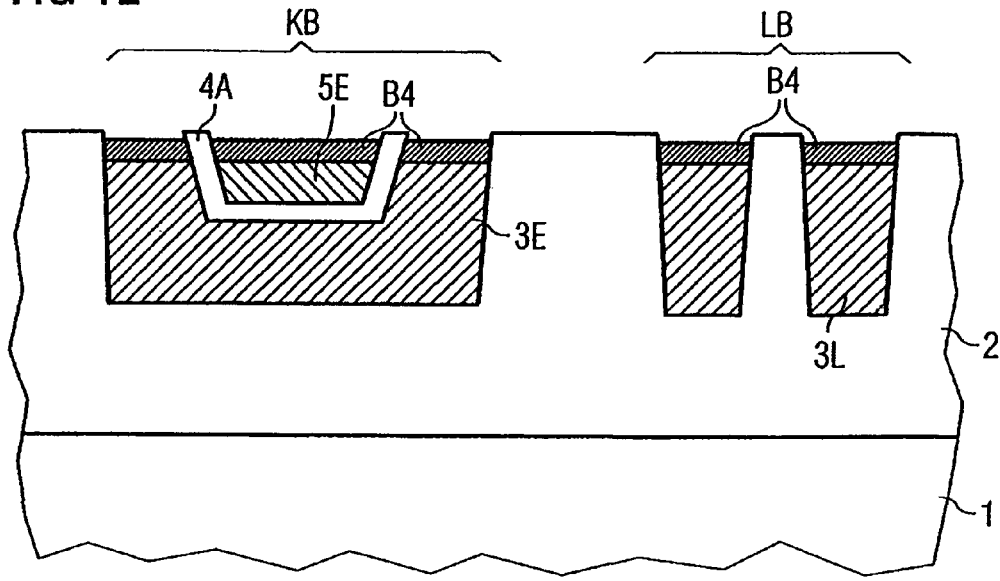
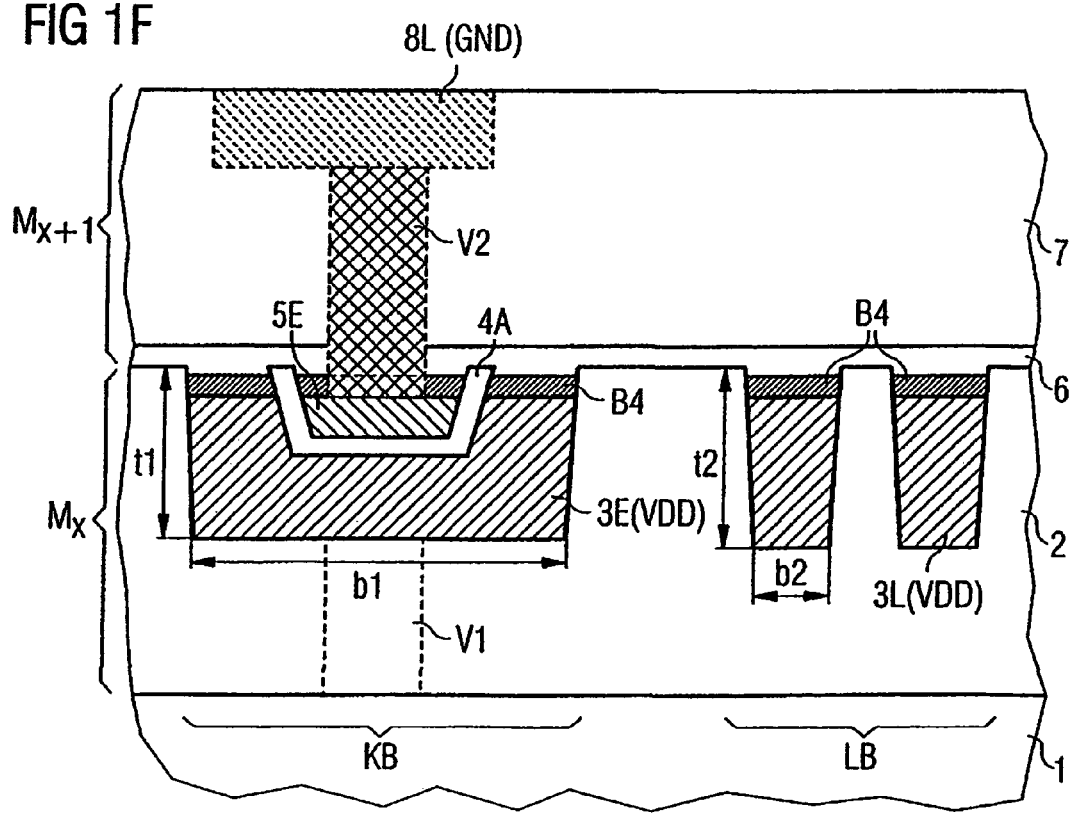

US 7,763,519 B2

METHOD FOR FABRICATING AN INTERCONNECT ARRANGEMENT WITH INCREASED CAPACITIVE COUPLING AND ASSOCIATED INTERCONNECT ARRANGEMENT

PRIORITY CLAIM

This application claims the benefit of priority to German Patent Application 10 2004 039 803.8 filed on Aug. 17, 2004, herein incorporated by reference in its entirety.

TECHNICAL FIELD

The present application relates to a method for fabricating an interconnect arrangement with increased capacitive coupling, and to an associated interconnect arrangement. In particular, the present application relates to a method for cost-effectively fabricating an interconnect arrangement to realize a stabilized supply voltage.

BACKGROUND

Stabilizing a supply voltage for integrated digital circuits uses capacitances between the supply voltage (VDD) and ground (GND). MOS capacitors (Metal oxide Semiconductor) are usually used, but they are wired through the entire metal stack or the entire wiring layer structure and increase the area used by the structure.

For "Mixed Signal Circuits", in which both analog and digital circuits are realized on a semiconductor component or chip, highly linear capacitances are used such as MIM caps (Metal Insulator Metal Capacitors). In the fabrication of MIM capacitors of this type, one to three additional masks are usually used for the patterning, thereby producing additional fabrication costs.

SUMMARY

A method for fabricating an interconnect arrangement with increased capacitive coupling, and an associated interconnect arrangement are disclosed in which the fabrication costs are significantly reduced. Furthermore, the quality of the capacitive coupling is also improved.

By way of example only, in one embodiment, after the formation of a first dielectric on a carrier substrate, a trench structure is formed in the first dielectric with a coupling or capacitor region having a first aspect ratio and an interconnect region connected thereto and having a second aspect ratio, which corresponds to at least triple the first aspect ratio. A first electrically conductive layer is thereupon deposited onto the patterned first dielectric to completely fill the trench structure in the interconnect region, a coupling or capacitor dielectric is formed on the first electrically conductive layer and a second electrically conductive layer is deposited on the capacitor dielectric until the trench structure has been completely filled in the capacitor region. Planarizing this layer structure as far as the first dielectric forms a first interconnect, a first coupling or capacitor electrode connected thereto and a second coupling or capacitor electrode without the use of additional masks within a metallization plane. The interconnect arrangement is completed by forming a second dielectric on the planarized surface of the layer structure with a second interconnect and a contact via that electrically connects the second capacitor electrode to the second interconnect.

In another embodiment, the first aspect ratio is less than 1/3 and the second aspect ratio is greater than 1, a depth of the trench structure in the capacitor region and in the interconnect region being approximately identical in magnitude and lying between 0.5 micrometer to 5 micrometers. In this way, it is possible to realize not only coupling capacitances but also the connection regions thereof without an additional outlay and thus cost-effectively.

In another embodiment, an electroplating method for the deposition of metallic material, and in particular copper, is carried out, a copper sulfate solution with deposition accelerators, and in particular organic accelerators, being used as electrolyte. On account of this deposition method and the additional additives used, extending deposition properties are obtained in combination with the aspect ratios mentioned above. The deposition properties for the interconnect regions result in high-quality interconnects with low electromigration and low resistance. The deposition properties in the capacitor region enable a first capacitor electrode with sufficient linear area coupling.

The first and second interconnects may be realized in the last two or topmost metallization planes of an integrated circuit, the first interconnect representing a supply voltage and the second interconnect representing an interconnect for ground. This realization provides a particularly high-quality stabilization of the supply voltage, an additional area requirement being minimal.

Furthermore, a wet-chemical etching back that is carried out selectively with respect to the coupling or capacitor dielectric and with respect to the first dielectric may be employed, thereby further improving the short-circuit properties between the first and second capacitor electrodes.

The foregoing summary has been provided only by way of introduction. Nothing in this section should be taken as a limitation on the following claims, which define the scope of the invention.

BRIEF DESCRIPTION OF THE FIGURES

The invention is described in more detail below on the basis of exemplary embodiments with reference to the drawing. In the figures:

FIGS. 1A to 1F show simplified sectional views for illustrating essential method steps in the fabrication of an interconnect arrangement according to the invention;

DETAILED DESCRIPTION

FIGS. 1A to 1F show simplified sectional views illustrating a method for fabricating an interconnect arrangement with increased capacitive coupling such as may be used in particular for stabilizing a supply voltage of digital circuits and "Mixed Signal Circuits" in integrated semiconductor circuits. Hereinafter, a capacitor region is understood to mean a coupling region for capacitively coupling electrically conductive regions, capacitor or coupling electrodes, the coupling electrodes being insulated from one another by a capacitor or coupling dielectric.

A first dielectric 2 is formed on a carrier substrate 1, a silicon oxide or a "Low-k Dielectric", i.e. a dielectric having a low dielectric constant, preferably being used. The carrier substrate 1 usually represents a further intermediate dielectric such as is used in particular for realizing wiring planes or metallization planes. However, the carrier substrate 1 may in the same way directly represent a semiconductor substrate such as silicon, for example, in which respective digital and/or analog integrated circuits are formed, or an electrically conductive carrier layer.

In one embodiment, the first dielectric 2 represents an insulation layer used as a penultimate dielectric in the metallization layer structure, such as is used for the penultimate metallization plane.

Figure 1A:
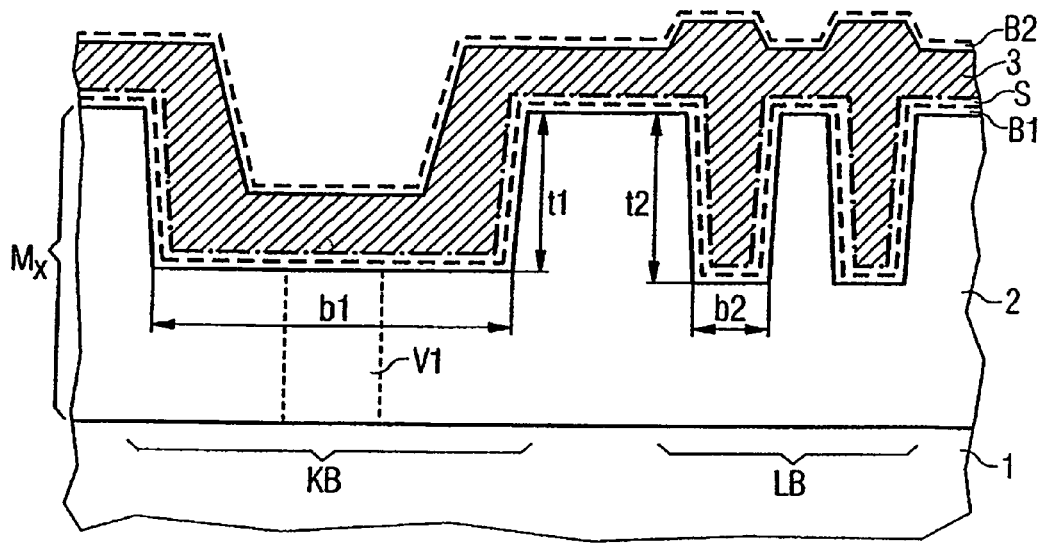

In accordance with FIG. 1A, afterward, for example by means of a damascene method, a trench structure is formed in the first dielectric 2 with a capacitor region KB and an interconnect region LB connected thereto.

Figure 2A:
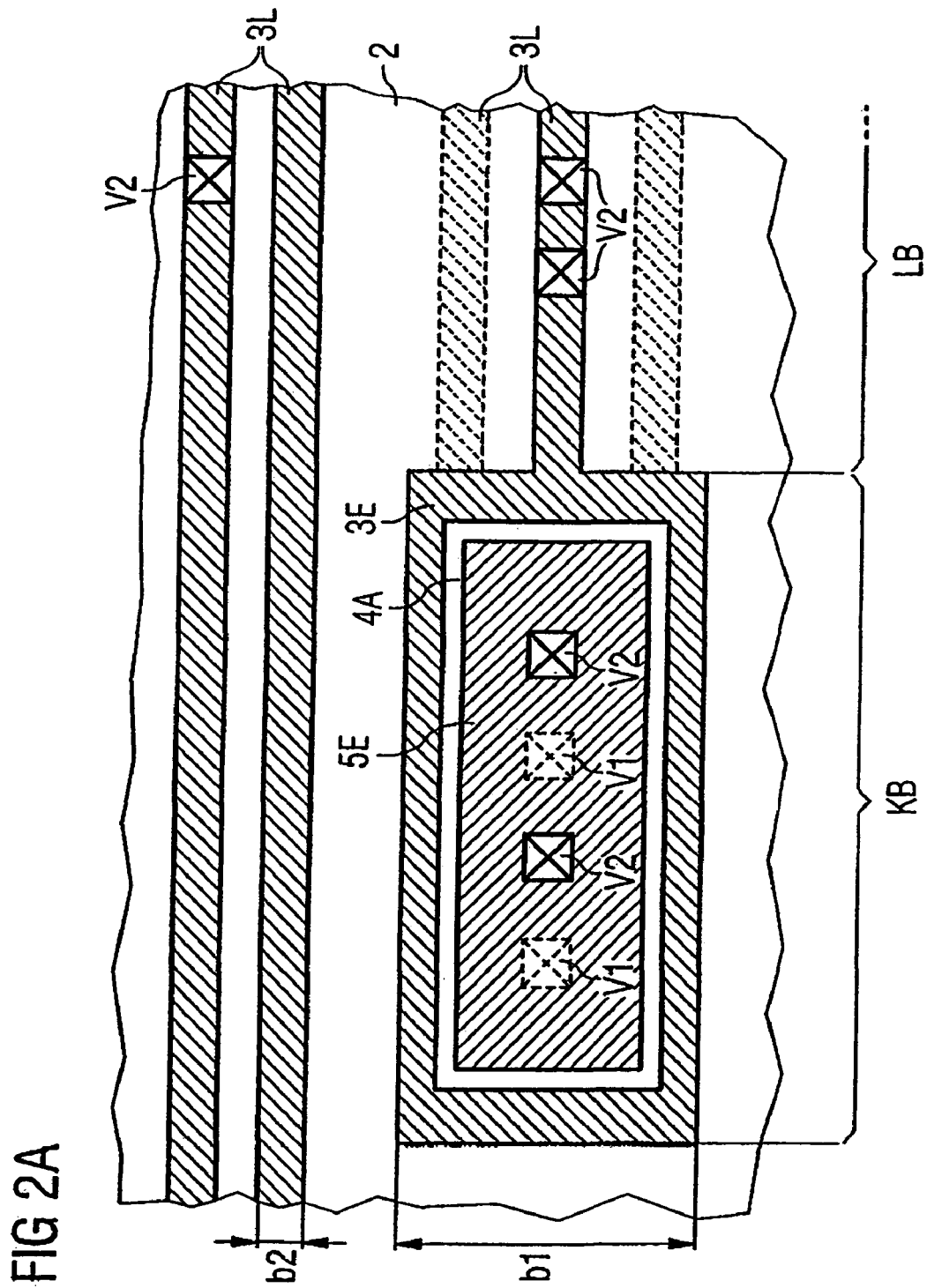
FIGS. 2A and 2B show a simplified plan view of the interconnect arrangement in accordance with a first and second exemplary embodiment.

In order to illustrate the structure, a plan view of the interconnect arrangement in accordance with a first exemplary embodiment is illustrated in FIG. 2A, which reveals the trench structure. The capacitor region KB has a first aspect ratio t1/b1 and the interconnect region LB has a second aspect ratio t2/b2, the second aspect ratio t2/b2 corresponding to at least triple the first aspect ratio t1/b1. Thus, if the depth for the capacitor region KB and the interconnect region LB are approximately identical, i.e. t1=t2, the width b1 of the trench structure in the capacitor region KB is accordingly at least three times as large as a width b2 of the trench structure of the interconnect region LB. In other words, the smallest structure widths b1 are at least three times as large as the smallest trench structure widths b2 of the interconnect region. This dimensioning is used for the electroplating method that is to be employed later.

In accordance with FIG. 1A, thin metallic diffusion barrier layers or liners B1 may optionally be formed essentially in a conformal manner at the surface of the first dielectric 2 and the trench structure thereof, for example by means of PVD, CVD, ALCVD or electroless deposition methods. This metallic diffusion barrier layer B1 comprises, for example, Ta, TaN, WN, WCN, TiN, or Ru, and essentially serves for avoiding diffusion of an electrically conductive layer that is subsequently to be formed into the adjacent dielectric layer or the first dielectric 2.

Furthermore, in accordance with FIG. 1A, a seed layer S may optionally be formed over the whole area, once again either directly at the surface of the first dielectric 2 or the first diffusion barrier layer B 1. In this case, a Cu seed layer may be formed. The seed layer S and diffusion barrier layer B 1 have a comparatively large thickness which is substantially less than the depths t1 and t2 of the trench structure in the capacitor region KB and interconnect region LB.

Afterward, in accordance with FIG. 1A, a first electrically conductive layer 3 is deposited onto the dielectric 2 and the trench structure formed therein over the whole area for as long as until the trench structure has been completely filled in the interconnect region LB.

Metallic material, such as copper, is deposited as the electrically conductive layer 3 by means of an electroplating method such that the narrow structures having the small width b2 in the interconnect region LB are completely filled and the wide structures having a large width b1 in the capacitor region KB are only partially filled. As an alternative to copper, other metals may be used such as Ag, Au, W, Al and alloys thereof.

FIGS. 3A to 3F illustrate the basic functioning of the electroplating method used and show various sectional views when carrying out a galvanic electroplating method in a trench structure, AD designating deposition accelerators such as are present as additives in the electrolyte used.

Figure 4:
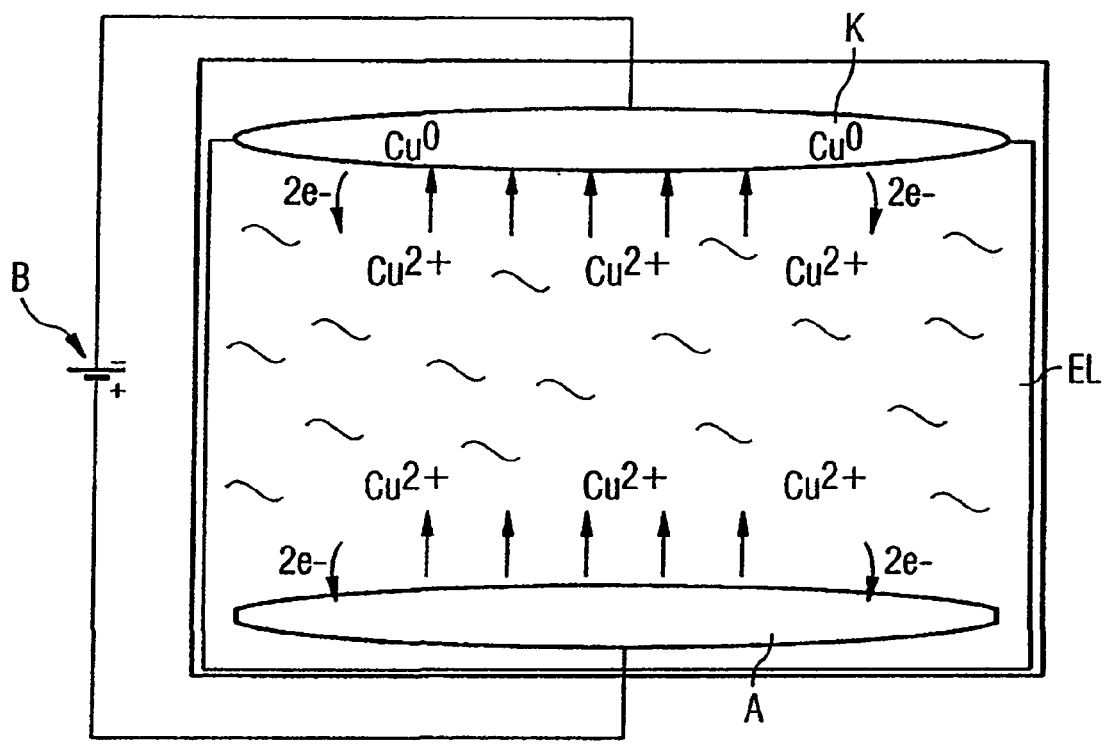
FIG. 4 shows a simplified illustration of a device for carrying out the electroplating method illustrated in FIG. 3.

A corresponding device for carrying out a Cu electroplating method of this type is illustrated in simplified fashion in FIG. 4, EL exhibiting an electrolyte that is situated in a container and has voltage applied to it by means of a battery B and cathodes K and anodes A connected thereto. The electrolyte EL used is, for example, a copper sulfate solution with a small proportion of deposition accelerators AB such as organic deposition accelerators AB. The proportion of the accelerators, in one embodiment, lie between 1 to 10 milliliters/liter.

The cathode K used is a semiconductor wafer, for example, on which the interconnect arrangement is intended to be formed. The anode A used may be a Cu anode, for example, which, in the case of the method described by way of example, dissolves over the course of time and emits copper ions $Cu^{++}$ to the electrolyte EL. Accordingly, in the case of the reaction occurring at the anode A, copper ions $Cu^{2+}$ are emitted to the solution and electrons $2e^-$ are taken up, as a result of which the anode A is slowly consumed. In the same way, at the cathode K or at the surface of the trench structure, an electron pair $2e^-$ is emitted and copper ions $Cu^{2+}$ are neutralized at the surface and attached as a neutral or uncharged Cu atom. Moreover, the electrolyte EL may have $H_2SO_4$ or other organic and/or inorganic additives.

Returning to FIG. 3A, the method of operation in particular of the deposition accelerators AB will now be described. The deposition accelerators AB are initially attached essentially at equidistant distances from one another at the surface of the dielectric or the trench structure and have a low mobility. On account of the deposition accelerators AB, an increased deposition rate results for the electrically conductive layer 3 or the Cu atoms. From the accordingly increased number of deposition accelerators AB in a trench structure, which essentially results from the additional side areas or the depth of the trench, a deposition or filling behavior that differs with respect to the planar surface of the dielectric therefore arises. Since, in accordance with FIGS. 3B to 3F, the deposition accelerators AB have only a low mobility and thus essentially remain at the same location, over the course of time an increased density of the deposition accelerators AB results for trench regions, which leads to an accelerated filling or deposition of Cu atoms. Whereas a small deposition thickness is obtained at the planar surface regions of a dielectric, a complete filling and even overfilling are produced at the locations of a trench structure on account of this effect. Advantages may thereby be afforded in particular for specific aspect ratios.

Returning to FIG. 1A, the first electrically conductive layer is accordingly formed by the above deposition method, as a result of which wide trench structures having a first aspect ratio in the capacitor region KB are filled only incompletely, while narrow trench structures having a second aspect ratio in the interconnect region LB are filled, and perhaps even overfilled provided that the second aspect ratio is at least three times as large as the first aspect ratio. The trench structures filled in the interconnect region LB have a high material quality such that reduced electromigration phenomena and improved resistance values can be observed.

Figure 2B:
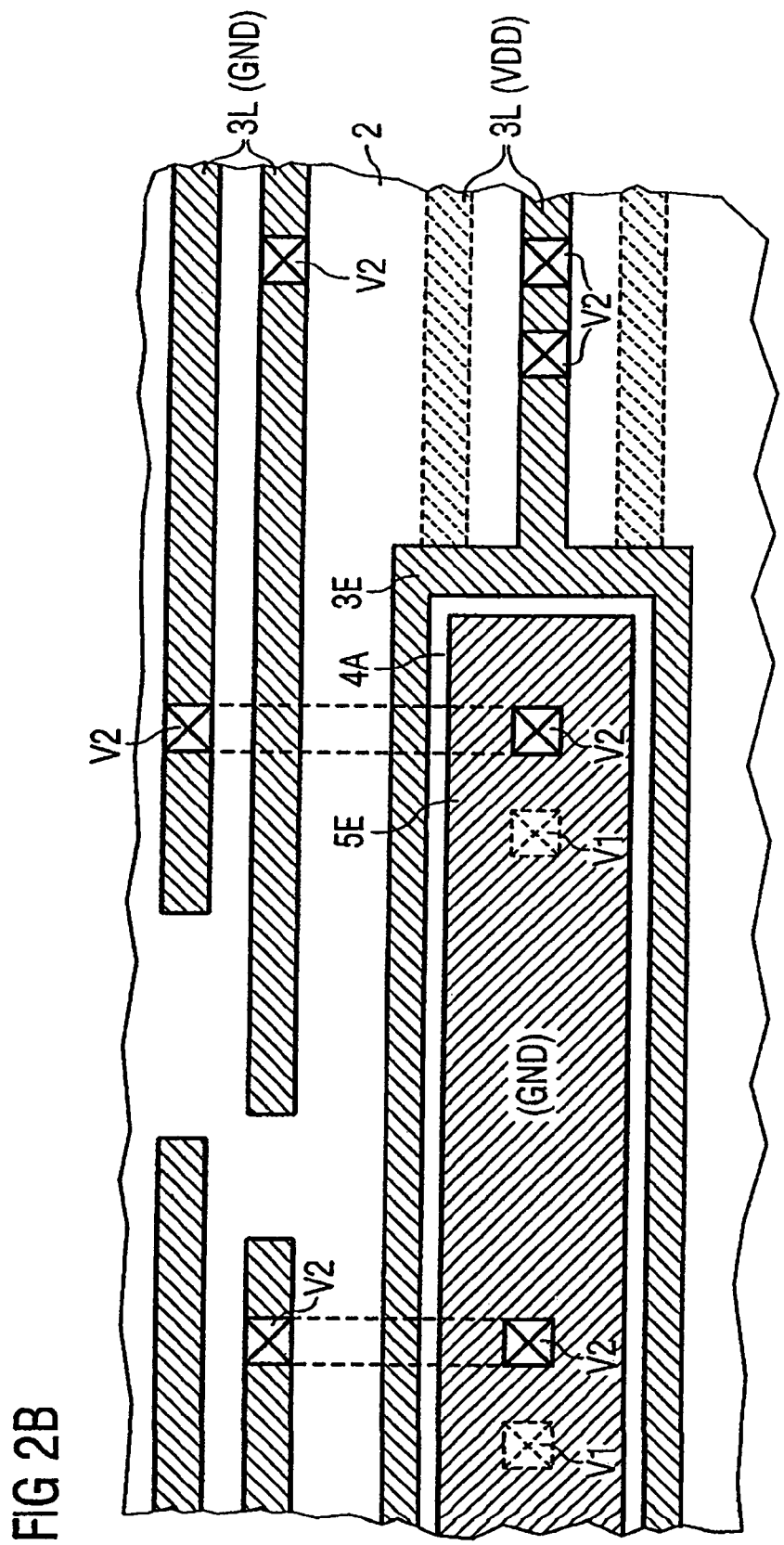
Figure 3A:
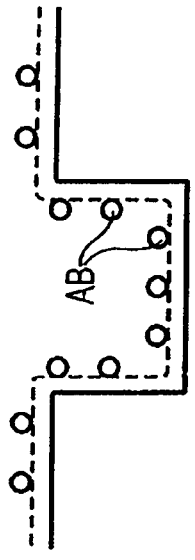
FIGS. 3A to 3F show simplified sectional views for illustrating the electroplating method used with deposition accelerators.
Figure 3B:
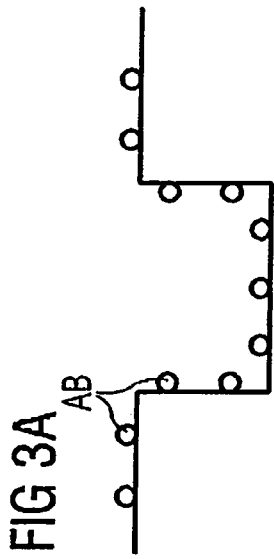
Figure 3C:
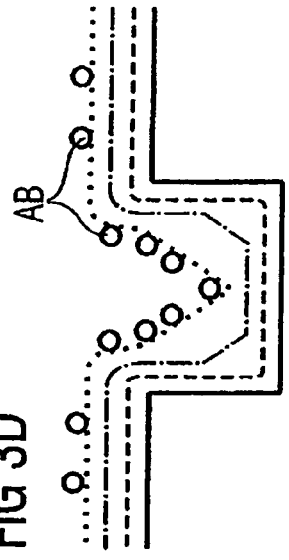
Figure 3D:
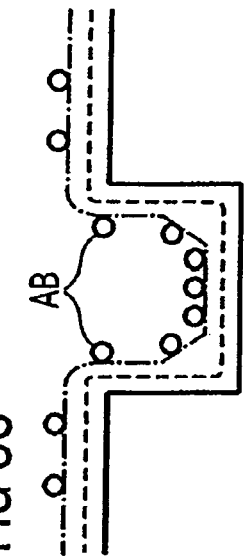
Figure 3E:
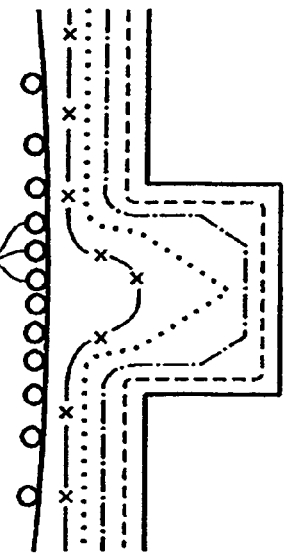
Figure 3F:
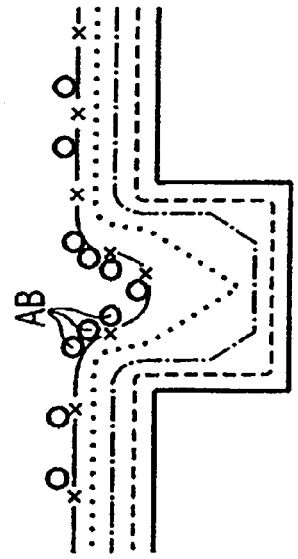

Furthermore, in accordance with FIGS. 2A and 2B, the capacitor region KB can be electrically connected to the interconnect region LB without additional contacts.

After the formation of this first electrically conductive layer 3, a thin second metallic diffusion barrier layer B2 may optically be formed over the whole area once again at the surface. One or more materials such as Ta, TaN, W, WN, WCN, TiN, CoWP, CoWB, NiMoP, or Ru are deposited for this second diffusion barrier layer. This second diffusion barrier layer B2 is again thin enough such that the partially filled trench structure in the capacitor region KB is under no circumstances completely filled.

Figure 1B:
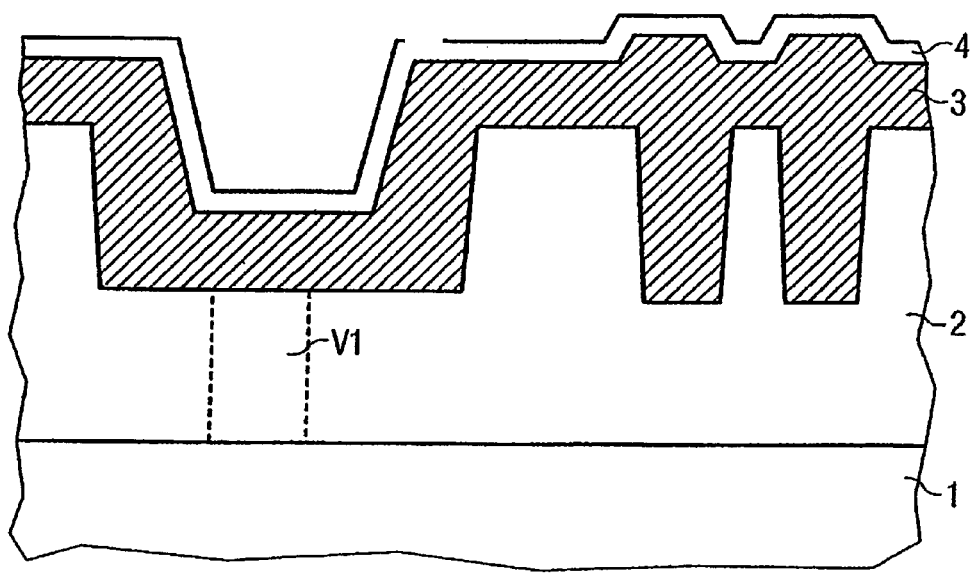

In accordance with FIG. 1B, subsequently, a coupling or capacitor dielectric 4 is then formed on the first electrically conductive layer 3 or the second diffusion barrier layer B2. By way of example, a dielectric having a thickness of 10 nanometers to 200 nanometers may be deposited over the whole area, either directly at the surface of the first electrically conductive layer 3 or else at the second diffusion barrier layer B2. This capacitor dielectric serves as an isolating dielectric for a strongly capacitively coupled interconnect arrangement such as is used in particular for a supply voltage VDD with respect to a ground GND. By way of example, $Si_3N_4$, $SiO_2$, SiC, SiCN, $Ta_2O_5$, $Al_2O_3$, $HfO_2$ or other "high-k dielectrics", i.e. dielectrics having a high dielectric constant, are used as materials for a capacitor dielectric of this type.

Figure 1C:
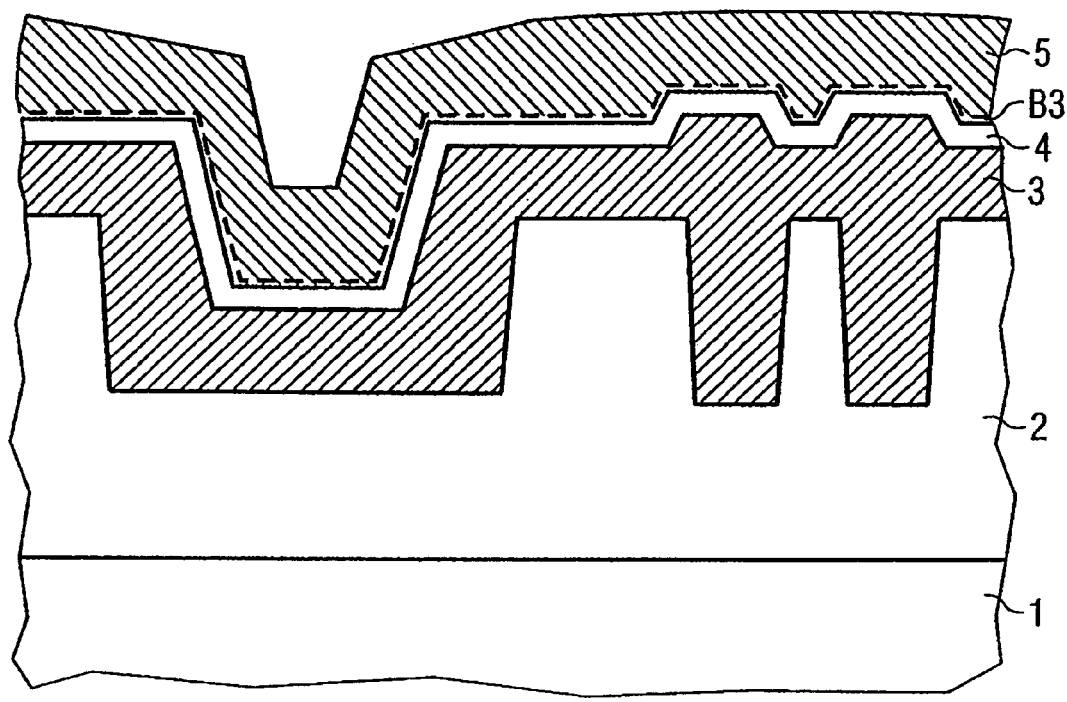

In accordance with FIG. 1C, after the deposition of the capacitor dielectric 4, a third metallic diffusion barrier layer B3 may again optionally be deposited over the whole area at the surface of the capacitor dielectric 4. Examples of materials used for the third metallic diffusion barrier layer B3 include Ta, TaN, WN, WCN, TiN, or Ru. A second electrically conductive layer 5 is subsequently deposited over the whole area at the surface of the third metallic diffusion barrier layer B3 or else directly at the surface of the capacitor dielectric 4 until the trench structure in the capacitor region KB, too, is completely filled. A metallic material such as, for example, Cu, Ag, Au, W, or Al, may be used as material for the second electrically conductive layer 5. In this case, the galvanic electroplating method described above, PVD, CVD or electroless electroplating methods may be used. The requirements for this second deposition method are substantially lower, however, since all that is involved is complete filling of the trench structures in the capacitor region KB.

In accordance with FIG. 1D, a method for planarizing the layer structure formed on the first dielectric 2 down to the first dielectric 2 is subsequently carried out, thereby forming a first interconnect 3L in the interconnection region LB, a first capacitor electrode 3E in the capacitor region KB, which is directly electrically connected to the first interconnect 3L in accordance with FIG. 2 or is formed integrally therewith, and a second capacitor electrode 5E, which is isolated or insulated from the first capacitor electrode 3E by the capacitor dielectric 4A. Accordingly, both finely patterned first interconnects 3L and the capacitor electrodes 3E and 5E for a high-quality capacitive coupling of interconnects are formed in a single planarization. Moreover, the first interconnects 3L are also simultaneously connected to the first capacitor electrode 3E, or are electrically connected thereto. It is also possible to form further interconnects in the same plane which are not connected to the capacitor electrode 3E.

Figure 1D:
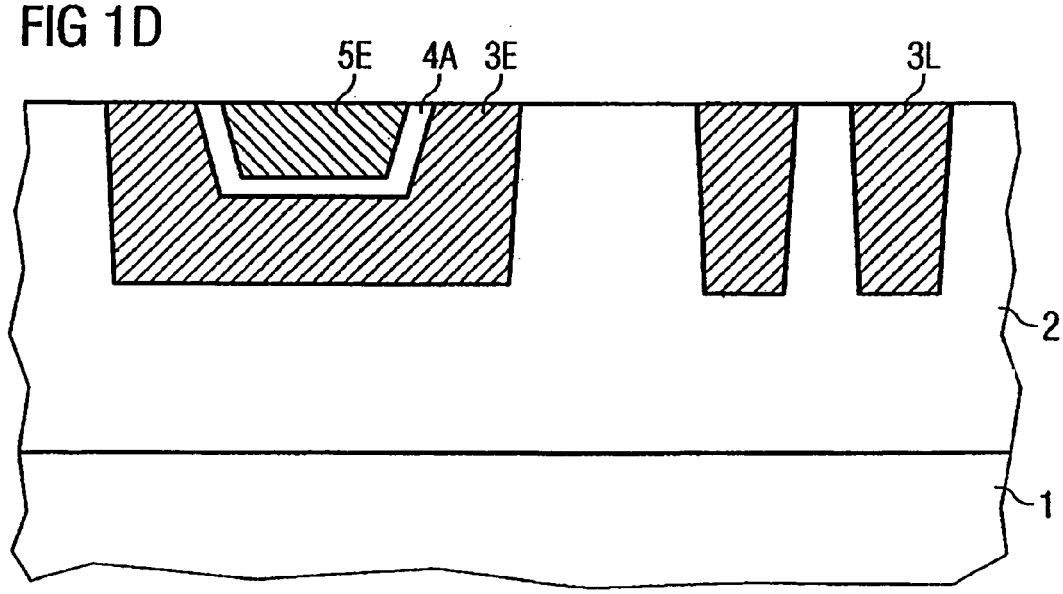

A chemical mechanical polishing (CMP) may be used for the planarizing method illustrated in FIG. 1D. It is also possible to carry out an electropolishing method that involves removing all layers or layer portions which project beyond the original first dielectric surface.

In accordance with FIG. 1E, the now uncovered surfaces of the electrically conductive layers 3E and 5E or the uncovered metal surfaces thereof can be protected by a selectively deposited fourth metallic diffusion barrier layer B4. By way of example, it is possible to deposit CoWP, CoWS or NiMoP by means of an electroless plating method or W by means of a selective CVD method. In this way, a self-aligning method can be used to reliably prevent electrical short circuits or leakage currents from arising at the junctions between the first capacitor electrode 3E and the second capacitor electrode 5E.

Optionally, the surfaces of the first and second capacitor electrodes 3E and 5E can be etched back selectively with respect to the capacitor dielectric 4A and with respect to the first dielectric 2 for example wet-chemically or by means of dry etching, as a result of which the structure set back in FIG. 1E is obtained. The occurrence of short circuits or leakage currents between the capacitor electrodes 3E and 5E can thereby be further reliably prevented.

In accordance with FIG. 1F, a cap dielectric is subsequently formed or deposited as a dielectric diffusion barrier layer 6 over the whole area on the first dielectric 2 and the capacitor electrodes 3E and 5E or the fourth metallic diffusion barrier layer 134 and the capacitor dielectric 4A. Deposition of the cap dielectric is also optional, particularly if the fourth metallic diffusion barrier layer B4 has already been formed beforehand. Examples of materials that may be used for the cap dielectric or the dielectric diffusion barrier layer 6 include Silicon nitride, SiC, SiCN.

Finally, a second dielectric 7 such as an intermetal dielectric is formed on the planarized surface of the layer structure or, if present, on the dielectric diffusion barrier layer 6. The second dielectric 7 may contain silicon oxide, FSG or a "low-k dielectric". The layer thicknesses of the dielectrics 2 and 7 correspond to the layer thicknesses that are usually present in a standard process. Furthermore, a second interconnect 8L is formed within the second dielectric 7 once again by means of a damascene method, for example, a contact-connection to the second capacitor electrode 5E being effected by means of at least one contact via V2 that extends either as far as the second capacitor electrode 5E or as far as the metallic fourth diffusion barrier layer B4. Contact vias V2 of this type may also optionally contact-connect the narrow interconnects 3L. Furthermore, in accordance with FIG. 1F, an optional contact via V1 may also be formed in the first dielectric 2, e.g. beneath the first capacitor electrode 3E in order, by way of example, to enable the first interconnect 3L and also the first capacitor electrode 3E to be reliably contact-connected to an underlying wiring structure (not illustrated). Contact vias V1 of this type may also optionally contact-connect the narrow interconnects 3L.

In order to realize optimum filling properties in an embodiment, the first aspect ratio t1/b1 is less than 1/3 and the second aspect ratio t2/b2 is greater than 1. Furthermore, the depths t1 and t2 of the trench structure in the capacitor and interconnect regions are approximately identical in magnitude and lie in a range of 0.5 micrometer to 5 micrometers. The width b1 of the trench structure in the capacitor region KB is greater than 2 micrometers and the width b2 of the trench structure in the interconnect region LB is less than 0.5 micrometer. In the above dimensioning and in the case where the first and second interconnects 3L and 8L are realized in the last two (i.e. topmost) metallization planes M, and MX+i of an integrated semiconductor circuit, a high-quality stabilization of the supply voltage can be made possible with minimal fabrication costs. In this case the supply voltage VDD is applied to the first interconnect 3L and a ground potential GND is applied to the second interconnect 8L.

Accordingly, a novel integration concept for realizing an interconnect arrangement with increased capacitive coupling is described, in which multiple lithography and etching processes are avoided and a significant reduction of costs is thus effected. In particular, by virtue of the specific filling behavior in the case of an electro-plating or electrodeposition method and a specific aspect ratio, it is possible to realize the quality features for interconnects with regard to improved electromigration properties and/or a reduced resistance.

In accordance with FIG. 2A, the first electrode 3E can be connected not only by means of a single first interconnect 3L but also by means of a multiplicity of first interconnects of this type, as a result of which a contact-connection of the first capacitor electrode 3E to a first interconnect structure can be further improved.

In accordance with FIG. 2B, it is also possible in particular to produce long capacitively coupled interconnects for, for example, a supply voltage VDD and a ground GND in a common metallization plane, a contact-connection of the bottom coupling or capacitor electrodes 3E being effected by means of one or more narrow interconnects 3L. The narrow interconnects 3L may be connected to the overlying or underlying metallization plane by means of contact vias V2 or V1. In the same way, the top coupling or capacitor electrode 5E may also be connected to the overlying metallization plane by means of contact vias V2.

The embodiments have been described above using specific materials for the dielectrics and the electrically conductive layers. However, it is not restricted thereto, but rather in the same way also encompasses alternative materials. Furthermore, line-type interconnect arrangements have been described. However, lattice-type interconnect arrangements or a stringing together of MIM capacitors can also be used in the same way.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A method for fabricating an interconnect arrangement, comprising:
   a) forming a first dielectric on a carrier substrate;
   b) forming a trench structure in the first dielectric with a capacitor region having a first aspect ratio and an interconnect region connected thereto and having a second aspect ratio, which is at least triple the first aspect ratio;
   c) depositing a first electrically conductive layer onto the patterned first dielectric in the capacitor and interconnect region until the trench structure has been substantially completely filled in the interconnect region by the first electrically conductive layer;
   d) forming a capacitor dielectric on the first electrically conductive layer;
   e) depositing a second electrically conductive layer on the capacitor dielectric until the trench structure has been substantially completely filled in the capacitor region, wherein the first electrically conductive layer, the capacitor dielectric, and the second electrically conductive layer form a layer structure;
   f) planarizing the layer structure on the first dielectric as far as the first dielectric in order to realize a first interconnect, a first capacitor electrode, which is connected to the first interconnect, and a second capacitor electrode, which is insulated from the first capacitor electrode by the capacitor dielectric, the first interconnect and first capacitor electrode being formed by the first electrically conductive layer, the second capacitor electrode being formed by the second electrically conductive layer, such that a surface of the first capacitor electrode, a surface of the second capacitor electrode, and a surface of the capacitor dielectric form a plane;
   selectively etching back the surface of the first capacitor electrode and the surface of the second capacitor electrode with respect to the surface of the capacitor dielectric by wet-chemical or dry etching such that the capacitor dielectric extends beyond both the surface of the first capacitor electrode and the surface of the second capacitor electrode;
   depositing a barrier layer on the surface of the first capacitor electrode, the surface of the second capacitor electrode, and the surface of the capacitor dielectric after etching; and
   g) forming a second dielectric on the planarized surface of the layer structure with a second interconnect and a contact via that connects the second capacitor electrode to the second interconnect.

2. The method as claimed in claim 1, wherein, in b), depths of the trench structure in the capacitor and interconnect region are approximately identical in magnitude and in a range of 0.5 micrometer to 5 micrometers.

3. The method as claimed in claim 1, wherein, in b), a width of the trench structure in the capacitor region is greater than 2 micrometers and a width of the trench structure in the interconnect region is less than 0.5 micrometer.

4. The method as claimed in claim 1, wherein, in c), a galvanic electroplating method for the deposition of metallic material is carried out.

5. The method as claimed in claim 4, wherein a copper sulfate solution with deposition accelerators is used as electrolyte.

6. The method as claimed in claim 1, wherein the first and second interconnects are the last two metallization planes of an integrated circuit.

7. The method as claimed in claim 1, wherein the first interconnect is an interconnect for a supply voltage and the second interconnect is an interconnect for ground.

8. The method as claimed in claim 1, wherein a metallic diffusion barrier layer for avoiding diffusion of the electrically conductive layer into adjacent dielectric layers is deposited in each case after at least one of b), c), d) or f).

9. The method as claimed in claim 1, wherein a wet-chemical etching back that is selective with respect to the capacitor dielectric and with respect to the first dielectric is carried out after f).

10. The method as claimed in claim 1, wherein a dielectric diffusion barrier layer is deposited after f).

11. The method as claimed in claim 1, wherein, in e), a PVD or CVD metal deposition method or a plating method for the deposition of a metallic conductive layer is carried out.

12. The method as claimed in claim 1, wherein a seed layer is formed prior to c) and e).

13. An interconnect arrangement comprising:
   a carrier substrate;
   a first dielectric formed on the carrier substrate;
   a trench structure formed in the first dielectric with a capacitor region having a first aspect ratio and an interconnection region connected thereto and having a second aspect ratio, the second aspect ratio at least triple the first aspect ratio;
   a first interconnect formed by a first electrically conductive layer substantially completely filling the trench structure of the interconnect region;
   a first capacitor electrode formed by the first electrically conductive layer partially filling the trench structure of the capacitor region;
   a second capacitor electrode substantially completely filling the partially filled trench structure of the capacitor region;

a capacitor dielectric arranged between the first and second capacitor electrodes;

wherein a surface of the first capacitor electrode, a surface of the second capacitor electrode, and a surface of the capacitor dielectric form a plane and the surface of the first capacitor electrode and the surface of the second capacitor electrode are selectively etching back with respect to the surface of the capacitor dielectric by wet-chemical or dry etching such that the capacitor dielectric extends beyond both the surface of the first capacitor electrode and the surface of the second capacitor electrode;

a barrier layer being deposited on the surface of the first capacitor electrode, the surface of the second capacitor electrode, and the surface of the capacitor dielectric after etching;

a second dielectric formed on the first dielectric and the filled trench structure;

a second interconnect, which is formed in the second dielectric and is connected to the second capacitor electrode by a contact via.

14. The interconnect arrangement as claimed in claim 13, wherein depths of the trench structure in the capacitor and interconnect region are approximately identical in magnitude and lie in a range of 0.5 micrometer to 5 micrometers.

15. The interconnect arrangement as claimed in claim 13, wherein a width of the trench structure in the capacitor region is greater than 2 micrometers and a width of the trench structure in the interconnect region is less than 0.5 micrometer.

16. The interconnect arrangement as claimed in claim 13, wherein a metallic diffusion barrier layer is disposed at least one of between the first capacitor electrode and the first dielectric or between the second capacitor electrodes and the second dielectric.

17. The interconnect arrangement as claimed in claim 13, wherein a dielectric diffusion barrier layer is formed at a surface of the first dielectric and the first interconnect formed therein, the first capacitor electrode, the capacitor dielectric and the second capacitor electrode.

18. The interconnect arrangement as claimed in claim 13, wherein the first and second interconnects are the last two metallization planes of an integrated circuit.

19. The interconnect arrangement as claimed in claim 13, wherein the first interconnect and the first capacitor electrode comprise electroplated copper.

20. The interconnect arrangement as claimed in claim 13, wherein the capacitor dielectric comprises $SiO_2$, $Si_3N_4$, SiC, SiCN, $Al_2O_3$, $Ta_2O_5$, $HfO_2$, $ZrO_2$ or another high-k dielectric.

21. The interconnect arrangement as claimed in claim 13, wherein the first interconnect is an interconnect for a supply voltage and the second interconnect is an interconnect for ground.

22. The interconnect arrangement as claimed in claim 13, wherein the first interconnect is contact-connected with the contact via.

23. A method for fabricating an interconnect arrangement, comprising:

forming a trench structure in a first dielectric, the trench structure including a capacitor region having a first aspect ratio and an interconnect region connected thereto and having a second aspect ratio at least triple the first aspect ratio;

applying a first electrically conductive layer to the interconnect region and the capacitor region, the first electrically conducive layer substantially completely filling the interconnect region without completely filling the capacitor region with the first electrically conductive layer;

forming a capacitor dielectric on the first electrically conductive layer in the capacitor region;

forming a second electrically conductive layer on the capacitor dielectric in the capacitor region until the trench structure in the capacitor region has been substantially completely filled planarizing the first capacitor electrode, the second capacitor electrode and the capacitor dielectric such that a surface of the first capacitor electrode, a surface of the second capacitor electrode, and a surface of the capacitor dielectric form a plane;

selectively etching back the surface of the first capacitor electrode and the surface of the second capacitor electrode with respect to the surface of the capacitor dielectric by wet-chemical or dry etching such that the capacitor dielectric extends beyond both the surface of the first capacitor electrode and the surface of the second capacitor electrode;

depositing a barrier layer on the surface of the first capacitor electrode, the surface of the second capacitor electrode, and the surface of the capacitor dielectric after etching.

24. The method as claimed in claim 23, further comprising planarizing the layer structure on the first dielectric.

25. The method as claimed in claim 24, further comprising planarizing the layer structure as far as the first dielectric to realize a first interconnect, a first capacitor electrode, which is connected to the first interconnect, and a second capacitor electrode, which is insulated from the first capacitor electrode by the capacitor dielectric.

26. The method as claimed in claim 25, further comprising forming a second dielectric on the planarized surface of the layer structure with a second interconnect and a contact via that connects the second capacitor electrode to the second interconnect.

27. The method as claimed in claim 23, wherein the first electrically conductive layer is formed by galvanic electroplating.

28. The method as claimed in claim 23, further comprising forming a diffusion barrier layer after at least one of: formation of the trench structure, filling the interconnect region with the first electrically conductive layer, or formation of the capacitor dielectric.

29. The method as claimed in claim 23, wherein depths of the trench structure in the capacitor and interconnect region are approximately identical in magnitude.

30. The method as claimed in claim 1, wherein in b) the first aspect ratio is less than 1/3 and the second aspect ratio is greater than 1.

31. The interconnect arrangement as claimed in claim 13, wherein the first aspect ratio is less than 1/3 and the second aspect ratio is greater than 1.

* * * * *